United States Patent
Okamura

[11] Patent Number: 5,936,975
[45] Date of Patent: Aug. 10, 1999

[54] SEMICONDUCTOR MEMORY DEVICE WITH SWITCHING CIRCUIT FOR CONTROLLING INTERNAL ADDRESSES IN PARALLEL TEST

[75] Inventor: Yoshifumi Okamura, Tokyo, Japan

[73] Assignee: NEC Corporation, Japan

[21] Appl. No.: 08/701,231

[22] Filed: Aug. 21, 1996

[30] Foreign Application Priority Data

Aug. 31, 1995 [JP] Japan .................................. 7-248673

[51] Int. Cl.[6] .................................................. G11C 29/00
[52] U.S. Cl. ........................................ 371/21.2; 371/27.6
[58] Field of Search ................................ 371/21.2, 27.6, 371/27.7; 365/233, 201, 230.06

[56] References Cited

U.S. PATENT DOCUMENTS

| | | | |
|---|---|---|---|
| 4,393,457 | 7/1983 | New ........................................ | 364/726 |
| 5,550,784 | 8/1996 | Takai ....................................... | 365/233 |
| 5,566,124 | 10/1996 | Fudeyasu et al. .................. | 365/230.06 |
| 5,629,903 | 5/1997 | Agata ...................................... | 365/233 |
| 5,675,549 | 10/1997 | Ong et al. ............................. | 365/233.5 |

FOREIGN PATENT DOCUMENTS

| | | | |
|---|---|---|---|
| 61-122998 | 6/1986 | Japan .............................. | G11C 11/34 |
| 3-283199 | 12/1991 | Japan .............................. | G11C 29/00 |

*Primary Examiner*—Hoa T. Nguyen
*Attorney, Agent, or Firm*—Hayes, Soloway, Hennessey, Grossman & Hage, P.C.

[57] ABSTRACT

A semiconductor memory device includes a burst counter for receiving an external address signal and generating an internal address signal for a predetermined burst length in synchronization with an external clock, and a switching circuit arranged such that, during the test mode, an address signal to be inputted to a column decoder which receives and decodes said internal address signal is switched, unlike under a normal mode, to be variable at each cycle, and a column select line to be outputted from said column decoder is configured so as to be variable at each cycle. The switching circuit may include first P-type transistors together with N-type transistors for selectively inputting predetermined lower order bits of said internal address signal to one of a decoder and a column decoder, second P-type transistors for selectively placing predetermined upper order bits of internal address signal to be in one of a conductive state and a non-conductive state with respect to said column decoder, and a latch circuit for holding values of said predetermined upper order bits. Because of the switching circuit, a parallel test for a plurality of cells can be carried out efficiently.

5 Claims, 6 Drawing Sheets

SEMICONDUCTOR MEMORY DEVICE WITH SWITCHING CIRCUIT FOR CONTROLLING INTERNAL ADDRESSES IN PARALLEL TEST

BACKGROUND OF THE INVENTION (1) Field of the Invention

The present invention relates to a semiconductor memory device, and more particularly to the controlling of internal addresses of a semiconductor memory device in a parallel test mode.

(2) Description of the Related Art

In recent years, as semiconductor memory devices with a large storage capacity have been manufactured, the time required for testing them has risen exponentially. This is a problem that external clock synchronous type memories ("synchronous memories") also face.

One known technique for solving the problem of increased time for testing semiconductor memory devices is disclosed in Japanese Patent Application Kokai Publication No. Sho 61-122998 (Convention priority from U.S. patent application Ser. No. 646,654 filed on Aug. 31, 1984, which proposes a method of applying a data bit to a device terminal in a writing operation conducted during a test mode to write the data into a plurality of memory cells in parallel, reading the data stored in the plurality of memory cells in parallel, detecting data identicality, that is, whether all the data are identical or not.

Japanese Patent Application Kokai Publication No. Hei 3-283199 filed by the NEC Corporation proposes a semiconductor memory device which has a parallel test circuit for a plurality of cells and which is capable of outputting the data read out as 1-bit or multiple-bit data and includes a plurality of selectors for dividing the read out data into a plurality of groups and sequentially outputting bit data out of the divided data of the groups according to a control signal and a plurality of identicality detection circuits for detecting the identicality of the bits of the data inputted by the selectors during a test mode, and which further comprises a multiple-bit parallel test circuit for detecting the identicality of the outputs of the plurality of the identicality detection circuits during the test mode for a 1-bit data output and also the identicality of the data sequentially outputted by the plurality of selectors. More specifically, the above publication describes a circuit configuration wherein circuits necessary for both a 4-bit output arrangement (hereinafter referred to as "X4 arrangement") and a 16-bit output arrangement (hereinafter referred to as "X16 arrangement") are disposed on the same chip and the output of the identicality detection circuit for the X16 arrangement is used as an input of the identicality detection circuit for 4-bit data of the X4 arrangement.

Figure 1:
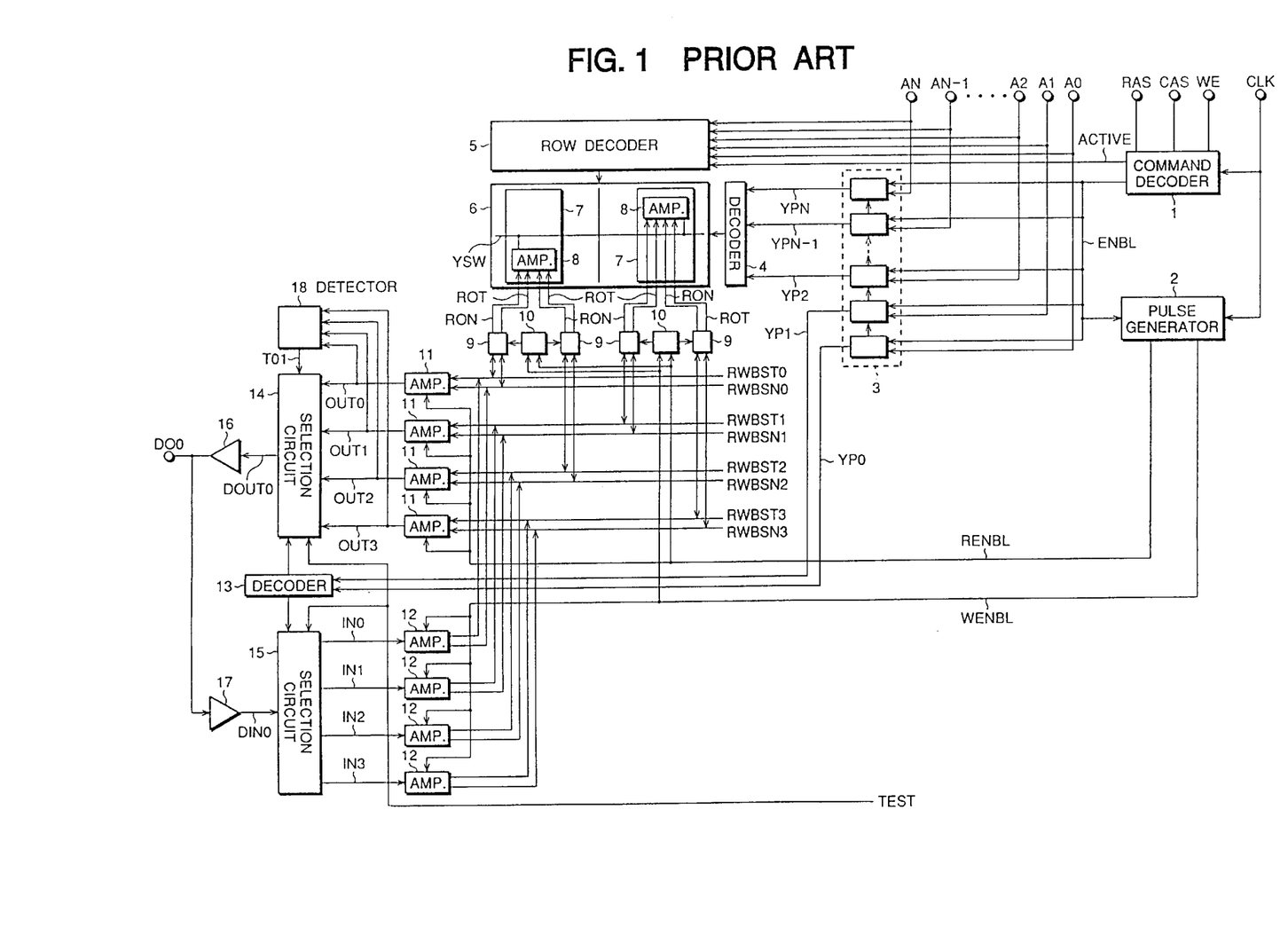
FIG. 1 is a block diagram of a prior art semiconductor memory device.

FIG. 1 of the accompanying drawings illustrates a prior art synchronous memory comprising a multiple-cell parallel test circuit that can carry out a parallel test as disclosed in Japanese Patent Application Kokai Publication No. Hei 3-283199.

Referring to FIG. 1, this prior art synchronous memory comprises a command decoder 1 for receiving as inputs external control signals of RAS (Row Address Strobe), CAS (Column Address Strobe) and WE (Write Enable) and an external clock signal CLK, a burst counter 3 for receiving an output signal ENBL of the command decoder 1 and a plurality of external address signals Ai (A0, A1, A2, ..., AN-1, AN) for outputting a plurality of internal address signals YPi (YP0, YP1, YP2, ..., YPN-1, YPN) (and comprising a plurality of serially connected flip-flops for counting and outputting internal address signals from latched external address signals for a predetermined burst length (which will be described later)) and a column decoder 4 for decoding internal address signals YPi (i=2, 3, ..., N) and for outputting a plurality of column selection lines YSW0, YSW1, etc.

The prior art synchronous memory also comprises a row decoder 5 for receiving a plurality of external address signals Ai (i=0 to N) and an output signal ACTIVE of the command decoder 1 and for outputting a plurality of word lines and a plurality of plate section signals, and a pair of shared sense amplifiers 8 each connected to four bit lines and two I/O bus pairs of ROTj, RONj (j=a, b, c, d, ...) for receiving column selection lines YSWn. Reference numeral 7 in FIG. 1 denotes selection plates for inputting an output signal of the decoder 4 and for outputting to a plurality of read/write bus.

Additionally, this prior art synchronous memory comprises a pulse generating circuit 2 for receiving an external clock signal CLK and an output signal ENLB of the command decoder 1 and for outputting a signal RENBL (read enable) and a signal WENBL (write enable), a precharge control circuit 10 for receiving a plate selection signal and output signals RENBL, WENBL of the pulse generating circuit 2 and for outputting a first data amplifier enable signal and an I/O bus precharge signal, a plurality of first data amplifiers 9 connected to the I/O bus pairs and the read/write bus pairs RWBSTn, RWBSNn (n=0, 1, ...) for receiving an output signal of the precharge control circuit 10, a plurality of second data amplifiers 11 for receiving the read/write bus pairs RWBSTn, RWBSNn and an output signal RENBL of the pulse generating circuit 2 and outputting data signals OUTn (n=0, 1, ...), and a detection circuit 18 for receiving four read/write bus pairs RWBSTn, RWBSNn, detecting the identicality of the four inputs and outputting a detection signal T01.

This prior art synchronous memory further comprises a decoder 13 for decoding internal address signals YP0, YP1 and outputting a selection signal, a selection circuit (selector) 14 for selecting an output data signal OUTn of the second data amplifier 11 and the detection signal T01 by a decode signal of the decoder 13 and a test mode enable signal TEST and outputting output signals DOUTj (j=0, 1, ...), a plurality of data-out buffers 16 for receiving an output signal of the selection circuit 14 and driving I/O pads DOj (j=0, 1, ...), a plurality of data-in buffers 17 for receiving data from the I/O pads DOj and outputting input data DINj (j=0, 1, ...), a selection circuit (selector) 15 for selecting a bus for the input data DINj of the data-in buffer 17 according to the decode signal of the decoder 13 and the test mode enable signal TEST and outputting input data signals INn (n=0, 1, ...), and a write amplifier 12 connected to the read/write bus pairs RWBSTn, RWBSNn for receiving the input data signals INn that are the outputs of the selection circuit 15.

Now, a write operation of the above described device, during the test mode, will be described.

During the test mode, all of the four write buses are selected by the selection circuit 15. As a result, the same data DINJ is written into the four read/write bus pairs RWBSTn, RWBSNn (n=j, j+1, j+2, j+3) and also into the four cells on the same column selection line YSW.

In a write operation during test mode, the four read buses are not selected by the selection circuit 15 and the output T01 of the detection circuit 18 (a detection signal obtained by detecting the identicality of the four inputs) is selected by the selection circuit 14, which in turn outputs it as an output data signal DOUTj.

Figure 2A:
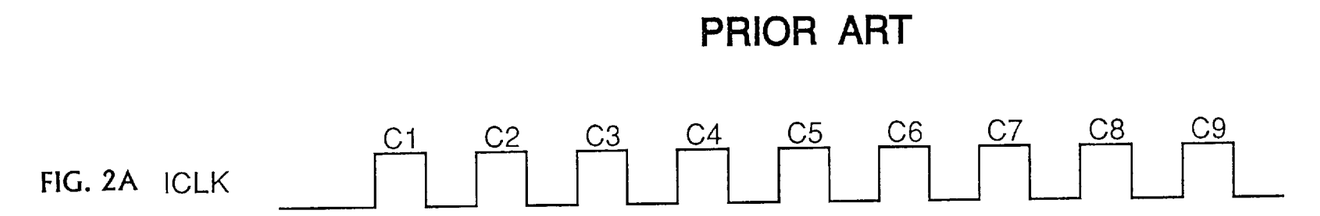
Figures 2B, 2C, 2D, 2E, 2F:
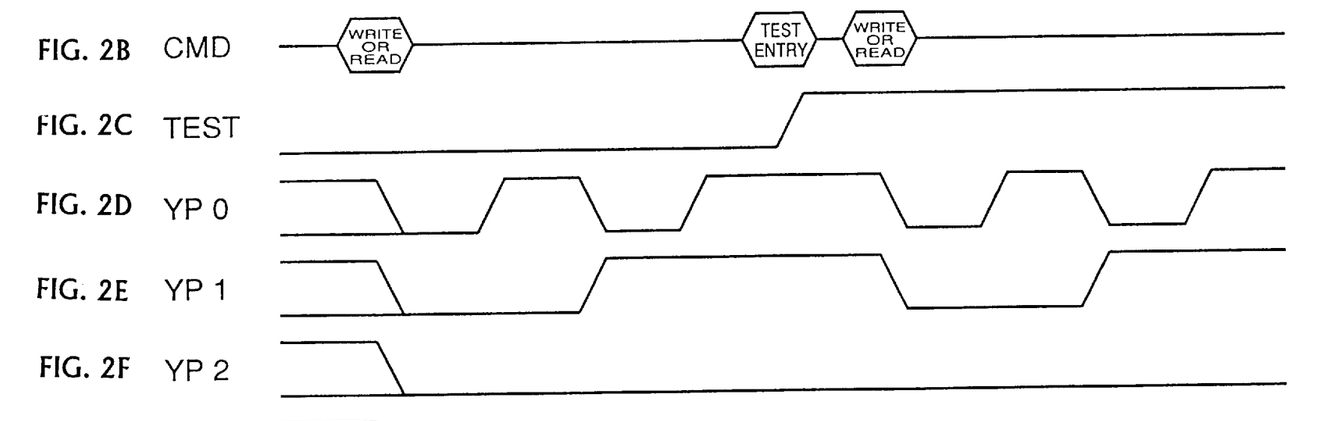
Figures 2G, 2H, 2I:
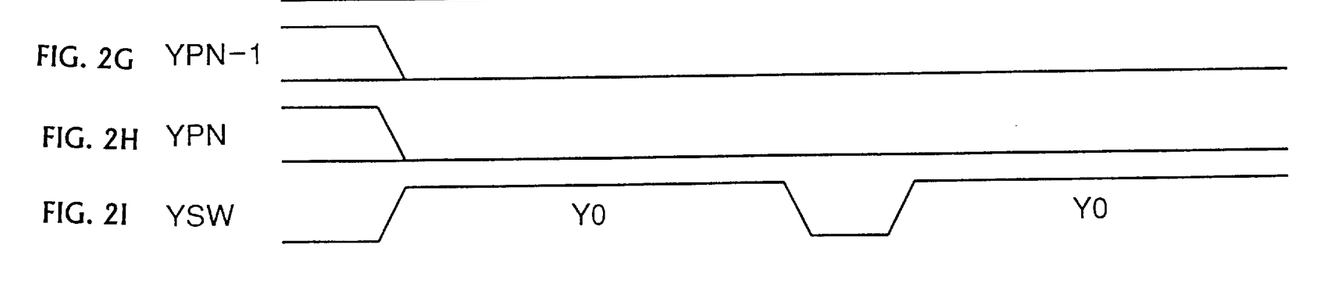

FIG. 2 shows the waveform of a column selection line YSW in a write or read operation of the prior art synchronous memory of FIG. 1.

Referring to FIGS. 1 and 2, when the number of data successively written in or read out (referred to as "burst length") is "4", a write or read command (CMD "WRITE" or "READ") is taken in at the rising edge of an external clock signal CLK (equivalent to ICLK (clock signal introduced into the memory)) in cycle C1 and an external address signal Ai (i=0 to N) is latched to the burst counter 3 by a signal ENBL that is an output of the command decoder 1, which burst counter 3 then outputs an internal address signal YPi.

In the example of FIG. 2, the internal address YPi i=0 to N) is set to YP=0.

From cycle C2 onwards, the burst counter 3 operates at each and every rising edge of the external clock signal CLK to count the internal address signals YP as 1, 2, 3 (that is, (YP0, YP1) becomes (1, 0), (0, 1), (1, 1) as the cycle moves on).

The above operation also takes place for executing a write or read command (CMD "WRITE" or "READ") upon the entry into the test mode (CMD "TEST ENTRY") (cycles C6 to C9).

As shown in FIG. 1, the lower order 2-bits YP0, YP1 (YP0 is the least significant bit) of the internal address signal outputted by the burst counter 3 are not inputted to the column decoder 4 but outputted to the selection circuit 14 or 15 through the decoder 13 for the sake of saving the operating current so that no switching operation is carried out on the column selection lines YSW when the burst length is "4" as shown in FIG. 2 (in other words, YSW is fixed to Y0).

With the prior art synchronous memory of FIG. 1, the column selection line YSW undergoes no switching operation during the burst when the burst length is "4" even during the test mode. Therefore, four write-in or read-out operations are conducted successively on the same cell in a 4-bit parallel test so far as to render the parallel test ineffective. In other words, since the combination of four (X4) input/output (I/O) column addresses (Y addresses) is the same as the combination of the four column addresses of the four data during the burst, the four successive data during the burst give rise to an access to four cells of the same column address (as the column selection line YSW is fixed), the parallel test cannot achieve the objective of improved efficiency, and thus, the effect of the test is lost.

The above problem is not solved by the arrangements disclosed in the Japanese Patent Application Kokai Publication Nos. Sho 61-122998 and Hei 3-283199.

SUMMARY OF THE INVENTION

An object of the present invention is, therefore, to overcome these problems in the prior art, and to provide a semiconductor memory device that is free from the above problem and that can carry out a parallel test efficiently for a plurality of cells in the memory having a burst counter.

According to one aspect of the invention, there is provided a semiconductor memory device having functions for conducting a parallel test in a test mode on a plurality of memory cells by writing one data in the plurality of memory cells in parallel and detecting identicality of data read out of the plurality of memory cells in parallel, the semiconductor memory device comprising:

a burst counter for receiving an external address signal and generating an internal address signal for a predetermined burst length in synchronization with an external clock; and a switching means arranged such that, when the test mode is selected and write/read operation takes place, an address signal to be inputted to a column decoder which receives and decodes the internal address signal is switched, unlike under a normal mode, so as to be variable at each cycle, and a column select line to be outputted from the column decoder is configured so as to be variable at each cycle.

In one form, the switching means may include first P-type transistors together with N-type transistors for selectively inputting predetermined lower order bits of the internal address signal to one of a decoder and a column decoder, second P-type transistors for selectively placing predetermined upper order bits of internal address signal to be in one of a conductive state and a non-conductive state with respect to the column decoder, and a latch circuit for holding values of the predetermined upper order bits.

In the semiconductor memory device having a burst counter according to the invention, the address signal inputted to the column decoder is switched (or changed) for every cycle in a write-in or read-out operation conducted during a test mode in order to switch the column selection line YSW so that a plurality of cells can be tested in parallel without carrying out a write-in or read-out operation on the same cells with the burst length being equal to or greater than "2". Thus, the time required for a test is reduced to a half for a burst length of "2" and to a quarter for a burst length of "4" or more if compared with a prior art device.

BRIEF DESCRIPTION OF THE DRAWINGS

The above and other objects, features and advantages of the present invention will be apparent from the following description of preferred embodiments of the invention explained with reference to the accompanying drawings, in which:

FIGS. 2A–2I are a chart showing waveforms obtained during the operation of the column selection line YSW of the prior art device of FIG. 1;

FIGS. 4A–4I are a chart showing waveforms obtained during the operation of the column selection line YSW of the embodiment of FIG. 3;

FIGS. 6A–6J are a chart showing waveforms obtained during the operation of the column selection line YSW of the embodiment of FIG. 5.

DETAILED DESCRIPTION OF PREFERRED EMBODIMENTS OF THE INVENTION

Now, preferred embodiments are explained with reference to the accompanying drawings.

Figure 3:
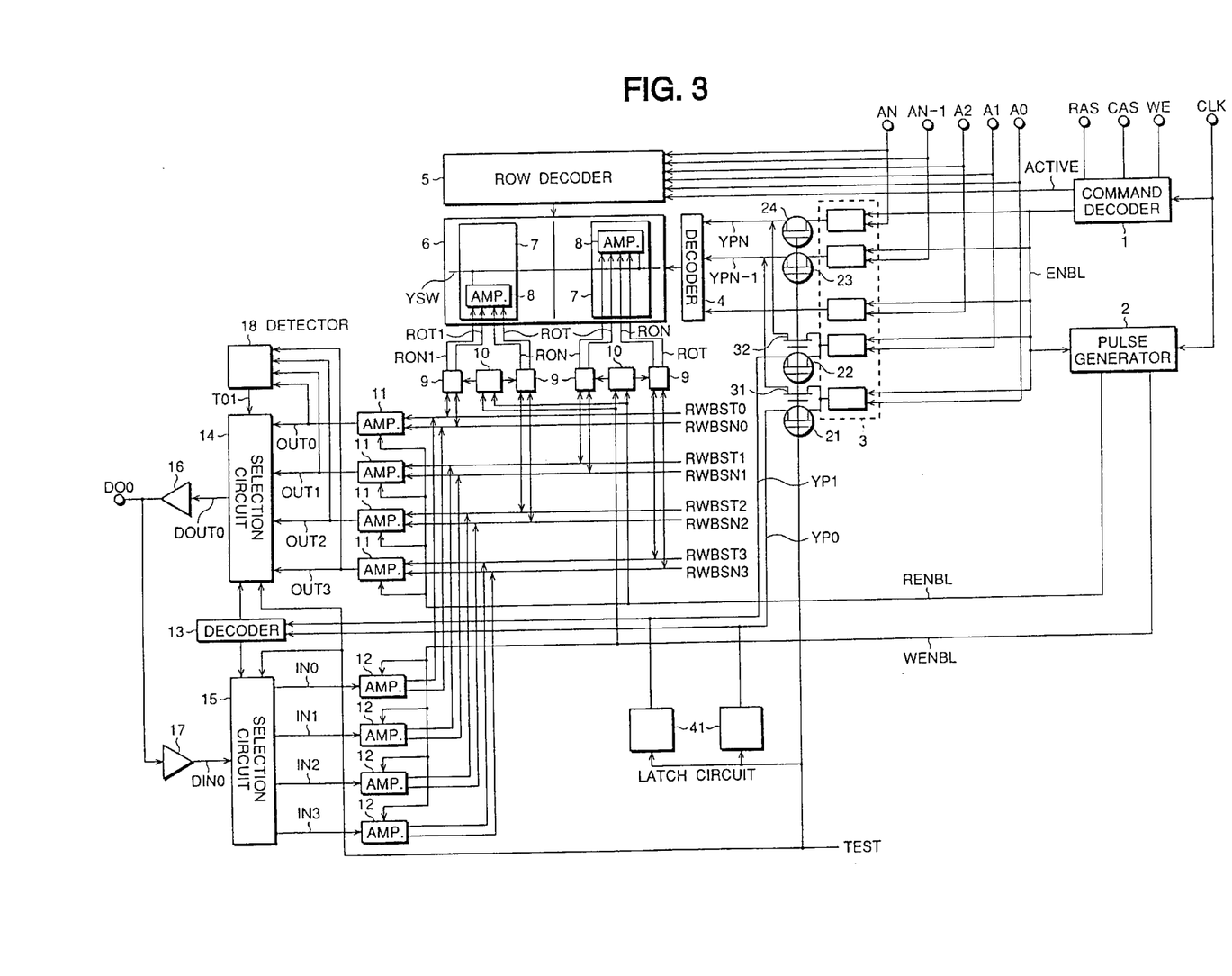
FIG. 3 is a block diagram of a semiconductor memory device according to a first embodiment of the invention.
Figure 4A:
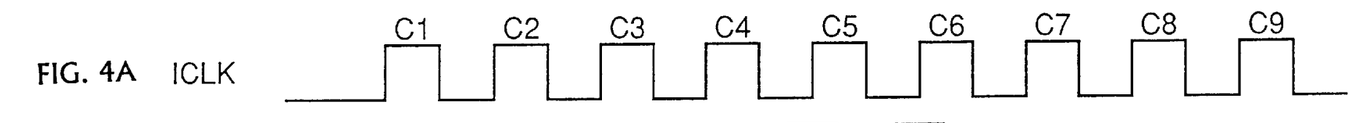
Figure 4B:
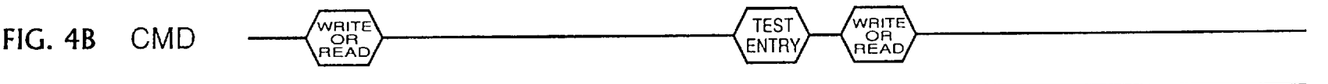
Figure 4C:
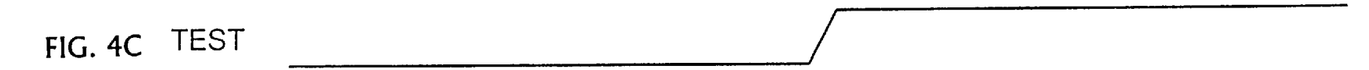
Figure 4D:
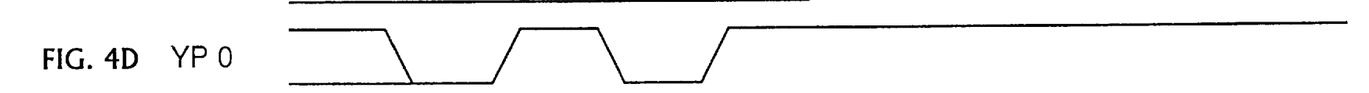
Figure 4E:
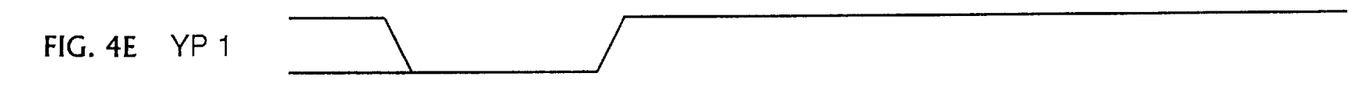
Figure 4F:
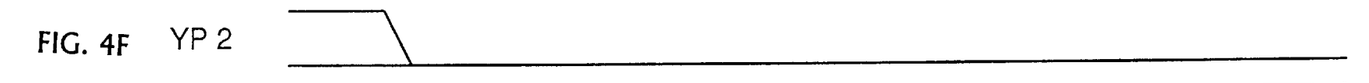
Figure 4G:
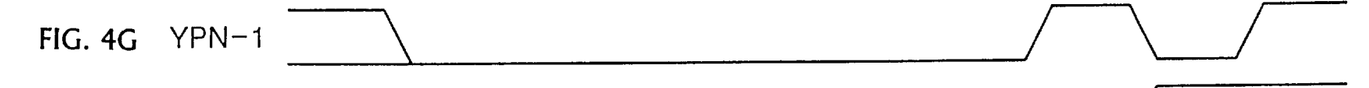
Figure 4H:
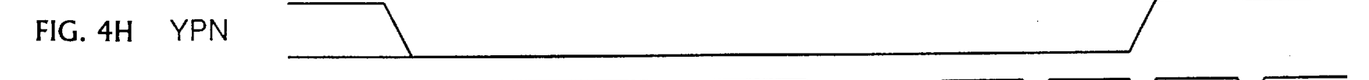
Figure 4I:
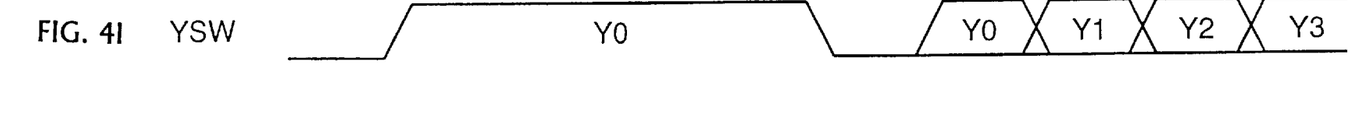

FIG. 3 shows a circuit diagram of a semiconductor device according to a first embodiment of the invention. In FIG. 3, those components that are the same as or similar to their counterparts in the prior art device of FIG. 1 are respectively denoted by the same reference numerals. Only the components that are different from the prior art device will be described hereinafter.

The first embodiment shown in FIG. 3 differs from the prior art device shown in FIG. 1 in that it additionally comprises P-type transistors 21, 22 and N-type transistors 31, 32 for selectively inputting lower order 2-bits YP0, YP1 of an internal address signal either to the decoder 13 or to the column decoder 4, P-type transistors 23, 24 for controlling internal address signals YPN-1, YPN so as to be in a state of being connected or in a state of unconnected to the column decoder 4, and a latch circuit 41 for holding the values of internal address signals YP0, YP1 in the test mode. The N-type transistors 31, 32 shown in FIG. 3 are turned ON when a test mode enable signal TEST inputted to their gates is at a high level so that they transmit and input lower order (LSB side) 2-bits of the output of the burst counter 3 to the column decoder 4 as higher (MSB side) 2-bits YPN, YPN-1, whereas the P-type transistors 21, 22 are turned ON when the test enable signal TEST inputted to the gate is at a low level (normal mode) so that they input lower order 2-bits of the output of the burst counter 3 to the decoder 13 as YP1, YP0.

During normal mode, all the selection P-type transistors 21, 22, 23, 24 are turned ON and all the selection N-type transistors 31, 32 are turned OFF as the test mode enable signal TEST is at a low level so that external addresses A0, A1 are inputted to the decoder 13 respectively as internal address signals YP0, YP1, and external addresses AN-1, AN are inputted to the column decoder 4 respectively as internal address signals YPN-1, YPN.

During test mode, the test enable mode signal TEST becomes a high level and all the selection P-type transistors, 21, 22, 23, 24 are turned OFF while all the selection N-type transistors 31, 32 are turned ON so that external addresses A0, A1 are inputted respectively as YPN-1, YPN to the column decoder 4, and the internal address signals YPN, YPN-1 corresponding to external addresses AN-1, AN become in an unconnected state relative to the corresponding input terminals of the column decoder 4, whereby the values of the previous data are held by the latch circuit 41 for internal address signals YP0, YP1.

The selectors 14, 15 are not affected by the decode signal inputted by the decoder 13 since it is controlled by a test enable signal TEST so that the internal addresses YP0, YP1 may take any values.

Now, the operation of the device of the first embodiment is explained.

FIG. 4 is a timing chart showing waveforms of the operation of the column selection line YSW during the write-in or read-out operation of the device of the first embodiment according to the invention.

The write-in or read-out operation of the first embodiment during the normal mode is similar to the one described in connection with FIG. 2. Namely, a write or read command is taken in at the rising edge of an external clock signal CLK (equivalent to ICLK in FIG. 4) in cycle C1, an external address signal Ai is latched to the burst counter 3, and the internal address signal (YP1 to YPN) is set to YP=0. In the subsequent cycles C2, C3, C4, the burst counter 3 operates at each and every rising edge of the external clock signal CLK to count the internal address signals YP as 1, 2, 3.

The internal address signals YP2 to YPN inputted to the column decoder 4 are not changed and, therefore, the column selection line YSW remains at Y0 and unswitched (fixed).

During the test mode, on the other hand, since the test enable signal TEST goes to high level, the internal address signals YP0, YP1 hold the previous data respectively.

The remaining internal address signals YPi (i=2, . . . , N-1, N) perform counting during the write-in or read-out operation, while the internal address signals YPN-1, YPN that are the outputs of the least significant 2-bits of the burst counter 3 (in a state where the N-type transistors 31, 32 are turned ON and connected to the lower order 2-bits of the burst counter 3) are counted. In other words, the N-type transistors 31, 32 are turned ON and the lower order 2-bits of the output of the burst counter 3 are inputted to the column decoder 4 as upper order 2-bits YPN-1, YPN of an internal address signal.

The column selection line YSW is switched to Y0, Y1, Y2, Y3, . . . for each cycle by these internal address signals (Refer to cycles C6 to C9).

Figure 5:
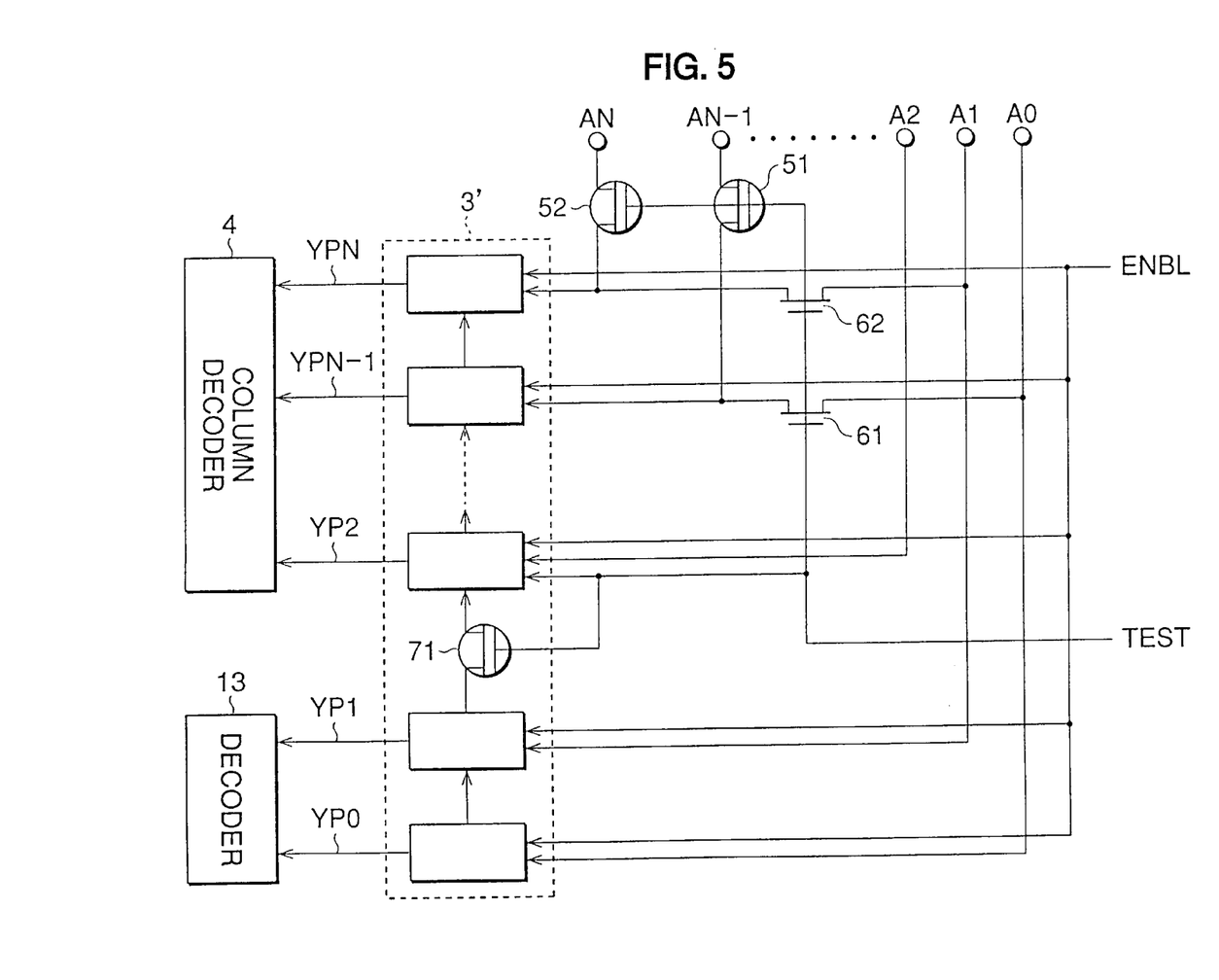
FIG. 5 is a block diagram of a semiconductor memory device according to a second embodiment of the invention.
Figure 6A:
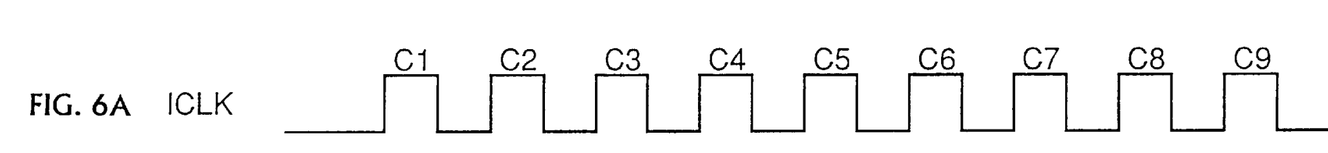
Figure 6B:
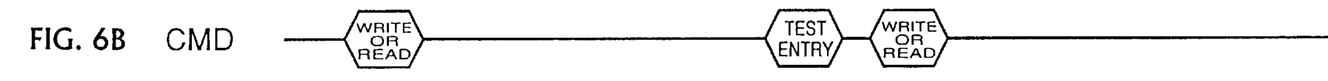
Figures 6C, 6D:
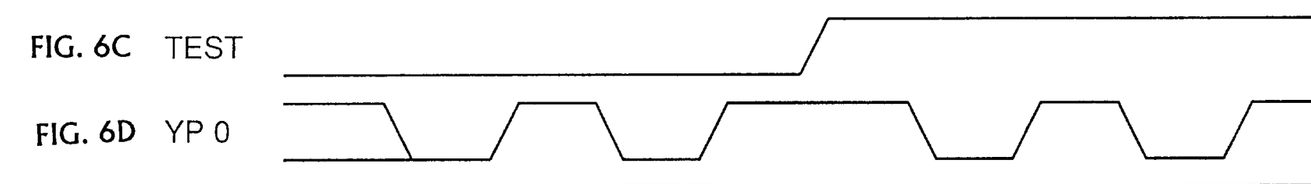
Figures 6E, 6F:
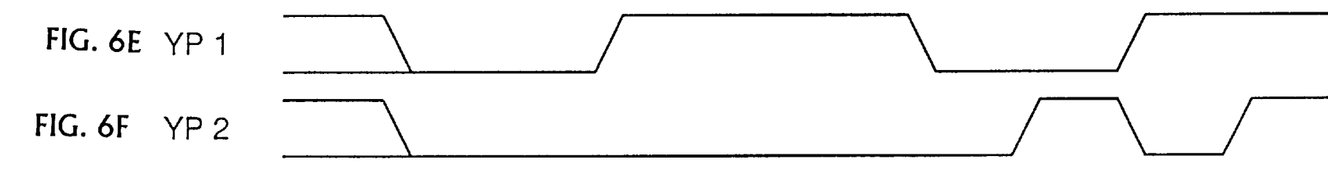
Figure 6G:
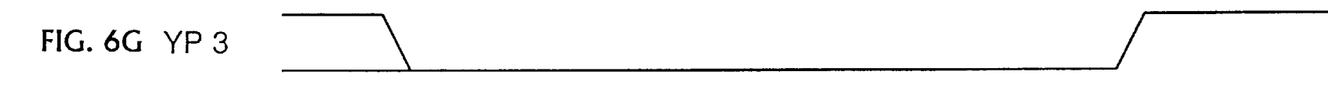
Figure 6H:
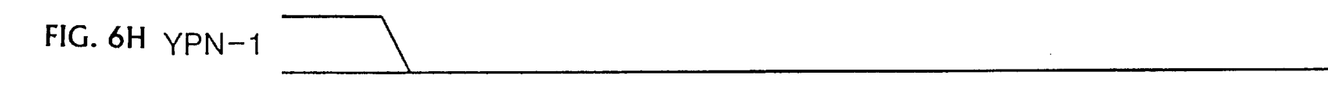
Figure 6I:
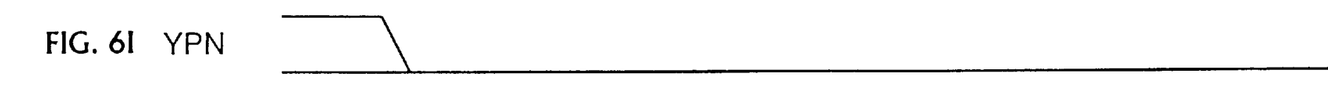
Figure 6J:
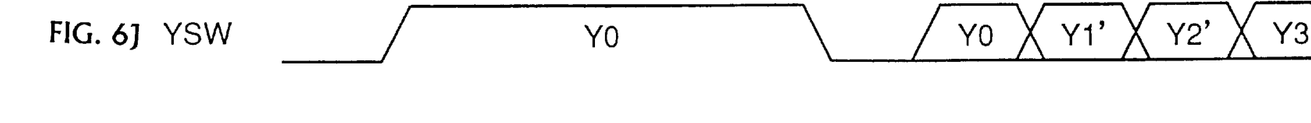

FIG. 5 shows a circuit diagram of a semiconductor device of a second embodiment according to the invention. In FIG. 5, those components that are the same as or similar to their counterparts in the embodiment of FIG. 3 are respectively denoted by the same reference numerals. Only the components that are different from the embodiment of FIG. 3 will be described hereinafter.

Referring to FIG. 5, the second embodiment comprises a burst counter 3' for receiving as external address signal Ai (i=0 to N), an output signal ENBL and a test mode enable signal TEST of the command decoder 1, disconnecting lower order 2-bits or less and lower order 3-bits or more and outputting a lower order third bit as the least significant bit (LSB) of the column decoder 4, a transistor 71 for disconnecting lower order 2-bits or less and lower order 3-bits or more at the burst counter 3', and selection transistors 51, 52, 61, 62 for switching the external address signal to be inputted to the burst counter 3'.

The transistor 71 is a P-type transistor having its gate connected to a test mode enable signal TEST, which transistor is turned ON when TEST is at a low level (during the normal mode) to connect a flip-flop output corresponding to lower order 2-bits to a flip-flop input corresponding to lower order 3-bits and turned OFF when TEST is at a high level (during the test mode) to disconnect the flip-flop corresponding to lower order 2-bits and the flip-flop corresponding to lower order 3-bits. The transistors 51, 52 are P-type transistors that are turned ON when the test enable signal TEST is at low level (for the normal mode) to supply the burst counter 3' with external addresses AN-1, AN as the most significant 2-bits of the burst counter 3'. On the other hand, the transistors 61, 62 are N-type transistors that are turned ON when the test enable signal TEST is at a high level (active) to supply lower order 2-bits A0, A1 of an external address as the most significant 2-bits of the burst counter 3'.

This second embodiment is so arranged that the output of the burst counter 3' is not inputted to the selection transistors 21, 22, 23, 24, 31, 32 shown in FIG. 3 but directly inputted to the column decoder 4 and the selector 14.

FIG. 6 is a timing chart showing waveforms of the column selection line YSW when the device of FIG. 5 is operated for a write-in or read-out operation.

For the write-in or read-out operation during the normal mode, the least significant 2-bits are counted and only the internal address signals YP0, YP1 are switched so that the column selection line YSW remains as Y0 as in the prior art device and the first embodiment (Refer to cycles C1 to C4).

During the test mode, the least significant 2-bits are counted and the internal address signals YP0, YP1 are switched (the flip-flops for lower order 3-bits or more being disconnected by the transistor 71) but the 3rd lowest order bit is counted as the least significant bit (LSB) of the column decoder 4 so that the internal address signals YP2, YP3 are switched (or changed) when an internal address signal is generated for a burst length of "4" by the burst counter 3' and the column selection line YSW is switched to Y0', Y1', Y2', Y3' for each cycle during the burst (Refer to cycles C6 to C9).

While the invention has been described in connection with its preferred embodiments, it is to be understood that the words which have been used are words of description rather than limitation and that changes within the purview of the appended claims may be made without departing from the true scope of the invention as defined by the claims.

What is claimed is:

1. A semiconductor memory device for conducting a parallel test in a test mode on a plurality of memory cells by writing one data in said plurality of memory cells in parallel and detecting identicality of data read out of said plurality of memory cells in parallel, said semiconductor memory device comprising:

a burst counter for receiving a plurality of external address signals and for generating a plurality of corresponding internal address signals for a predetermined burst length in synchronization with an external clock signal having a predetermined cycle, said internal address signals comprising upper order bits and lower order bits;

a switching circuit arranged for receiving said internal address signals and for selectively switching between said upper and lower order bits when the test mode is selected and write/read operation takes place;

a column decoder for receiving and decoding said switched internal address signals; and a column select line being provided by said column decoder in response to said switched internal address signals, said column select line varying at each said cycle.

2. A semiconductor memory device according to claim 1, wherein said switching circuit includes first P-type transistors together with N-type transistors for selectively inputting said lower order bits of said internal address signal to one of a decoder and said column decoder, second P-type transistors for selectively placing said upper order bits of internal address signal in one of a conductive state and a non-conductive state with respect to said column decoder, and a latch circuit for holding values of said upper order bits.

3. A semiconductor memory device according to claim 1, wherein said switching circuit includes selection transistors for said external address signal to be switched and inputted to predetermined bit positions.

4. A semiconductor memory device comprising:

a burst counter for receiving an external address signal, counting and for outputting an internal address signal of m+n bits (m and n being predetermined integers) in synchronization with an external clock;

a column decoder for receiving higher order m bits of said internal address signal and carrying out a first selection;

a selection plate for outputting data of a plurality of bits as selected by said first selection to a plurality of read/write bus pairs;

a detection circuit for detecting identicality of said plurality of bits from said bus pairs for a read operation in a parallel test mode;

a second selection circuit for selecting the data of a plurality of bits by lower order n bits of said internal address signal in a normal mode and the output of said detection circuit in a parallel test mode; and a third selection circuit for writing write data in one of said plurality of read/write bus pairs by lower order n bits of said internal address signal in a normal mode but in all of said plurality of read/write bus pairs in a parallel test mode.

5. A semiconductor memory device comprising:

a burst counter for receiving an external address signal, counting an internal address signal of m+n bits (m and n being predetermined integers) in synchronization with an external clock in a normal mode, counting only higher m bits in a parallel test mode, and outputting said internal address signal of m+n bits;

a column decoder for receiving higher order m bits of said internal address signal and for carrying out a first selection;

a selection plate for outputting data of a plurality of bits as selected by said first selection to a plurality of read/write bus pairs;

a detection circuit for detecting identicality of said plurality of bits from said bus pairs for a read operation in a parallel test mode;

a second selection circuit for selecting the data of a plurality of bits by lower order n bits of said internal address signal in a normal mode and the output of said detection circuit in a parallel test mode; and a third selection circuit for writing write data in one of said plurality of read/write bus pairs by the lower order n bits of said internal address signal in a normal mode but in all of said plurality of read/write bus pairs in said parallel test mode.

* * * * *